INVENTORS
THOMAS G. MARSHALL, JR.
& CARL G. SERIGHT
BY [signature]
ATTORNEY

INVENTORS
THOMAS G. MARSHALL, JR.
& CARL G. SERIGHT
BY [signature]
ATTORNEY

INVENTORS
THOMAS G. MARSHALL, JR.
& CARL G. SERIGHT
BY [signature]
ATTORNEY

United States Patent Office 3,111,603

Patented Nov. 19, 1963

3,111,603
TELEVISION DEFLECTION CIRCUIT

Thomas G. Marshall, Jr., Franklin Park, and Carl G. Seright, Trenton, N.J., assignors to Radio Corporation of America, a corporation of Delaware Filed July 2, 1959, Ser. No. 824,618
7 Claims. (Cl. 315—27)

This invention relates to deflection circuitry and in particular to an improved transistorized deflection circuit.

In the manufacture of television receivers, especially those designed for ease of portability and for operability with a low power or battery supply, it is highly desirable to provide small inexpensive components of reduced weight and with high power efficiency. In a television receiver which incorporates electronic vacuum tubes for vertical deflection circuits, an output transformer or autotransformer or one or more inductors are generally employed. Such components usually are expensive, bulky and heavy. In addition, a large amount of power is normally dissipated in tube circuits of this type. Efficient deflection circuits are also desirable in other apparatus, for example, in oscilloscopes.

To overcome the difficulties mentioned above, transistorized deflection circuits which obviate the necessity for transformers or inductors have been proposed for developing a sawtooth waveform to be applied to a kinescope yoke winding. In one form, such deflection circuits employ a Class B push-pull transistor amplifier with complementary symmetry. One way of connecting a complementary symmetry push-pull transistor amplifier is to couple the signal input circuit with the base electrodes which are connected together. The emitters or output electrodes of the push-pull transistors are connected in common, and a load device or utilization means, such as a yoke winding, is connected between the emitters and a point of fixed reference potential, such as ground, for the system. The collectors are connected respectively to the positive and the negative terminals of a direct current power supply, such as a battery. Such push-pull transistor circuits are described, for example, in Proceedings of the IRE, June 1953, p. 717–724. The use of transistors instead of tubes as amplifiers can diminish TV receiver input power requirements and reduce overall weight in addition to providing improved sweep linearity and noise immunity. However, in prior proposed transistorized vertical deflection circuits for television receivers, increased efficiency was achieved at the expense of a lengthened retrace interval. Conversely, a reduction in retrace time resulted in reduced power efficiency An object of this invention is to provide an improved and more efficient push-pull amplifier circuit.

Another object of this invention is to provide an improved deflection circuit having increased efficiency.

Another object is to provide an improved transistorized vertical deflection circuit in a television receiver which affords greater operating efficiency for a given retrace interval.

A further object is to provide an improved transistorized deflection circuit in which the retrace interval may be shortened without sacrificing efficiency.

In acordance with this invention, diode means are incorporated in a complementary symmetry, transistor type, Class B push-pull amplifier in a deflection circuit, for example, that of a television receiver, so that the voltage of the common emitters or output electrodes is substantially increased during a portion of the retrace interval. The diode means are connected and poled so that the direct current voltage supply is isolated from the transistors for a part of the retrace interval, thus preventing the clamping of the emitters to the supply bias voltage.

At the end of the trace period, a large flyback pulse voltage from the yoke which exceeds the supply voltage is impressed across the emitters of the transistor pair which allows a faster retrace interval, or increased power efficiency, or both.

The invention is described in greater detail with respect to the drawings, in which.

Figure 1:
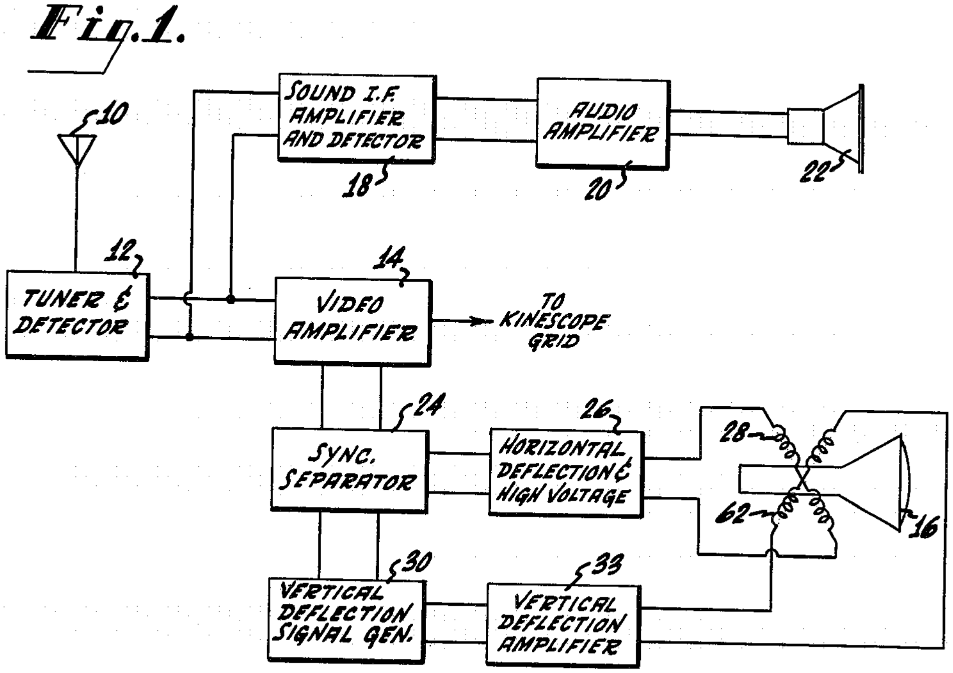
FIGURE 1 is a block diagram of a television receiver.

In FIGURE 1, a television receiver includes an antenna 10 which receives composite television signals, and from which the received signals are applied to a tuner and second detector 12. The tuner and second detector 12 includes a radio frequency amplifier and a frequency converter for converting the radio frequency signals to intermediate frequency signals, an intermediate frequency amplifier, and a detector for deriving the composite television signals from the intermediate frequency signals. A video signal portion of the composite television signals is amplified by a video amplifier 14 and is thereafter applied to the beam intensity control electrode system (e.g., grid) of a kinescope 16.

The sound portion of the composite television signals is processed by a sound channel which includes a sound intermediate frequency amplifier and detector 18 and an audio amplifier 20 for demodulation and amplification respectively of the audio signal in a known manner. The amplified audio signal is converted to audible sound waves by a loudspeaker 22.

In addition, a video portion of the composite television signals is applied to a sync separator circuit 24 which is connected to the video amplifier 14. The sync separator circuit 24 supplies synchronizing pulses to a horizontal deflection and high voltage circuit 26 from which a sawtooth waveform is derived for application to a horizontal deflection yoke winding 28 that is mounted about the neck of the kinescope 16.

Figure 3:
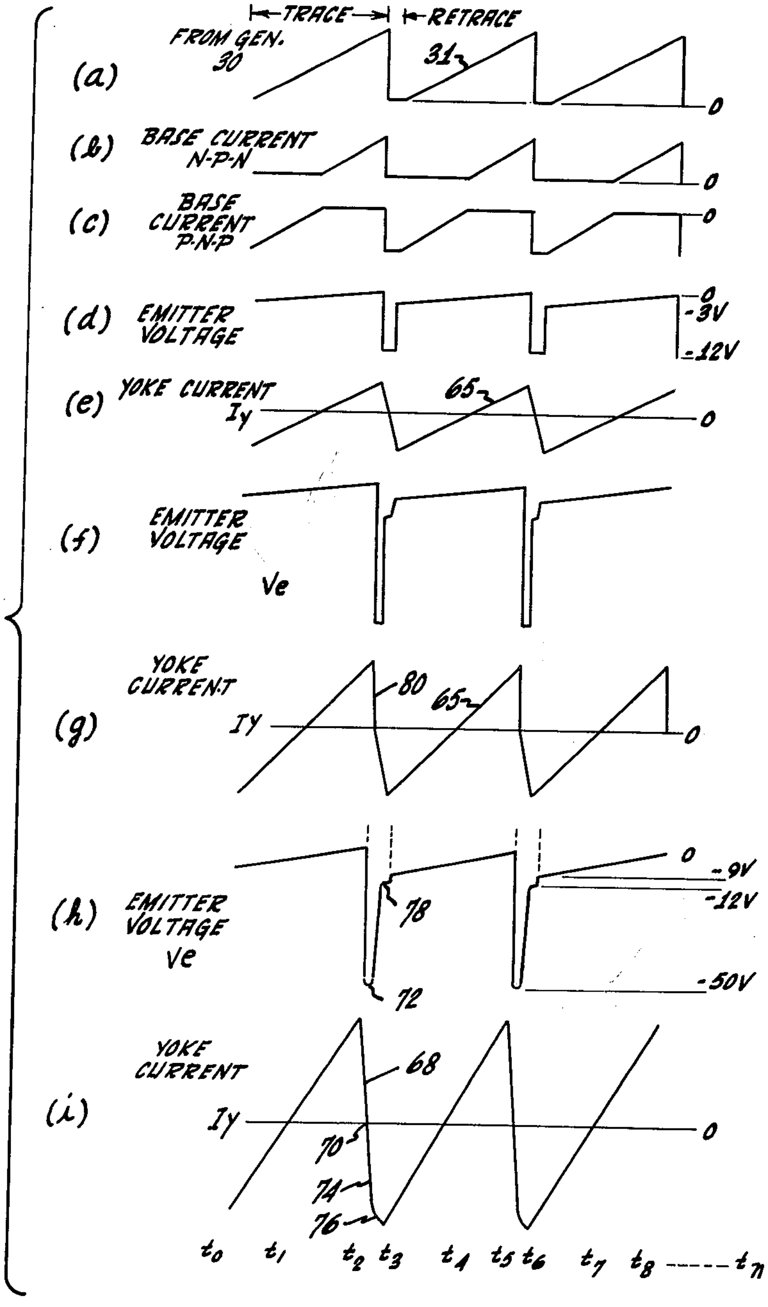
FIGURE 3 is a series of idealized graphs illustrating voltage and current waveforms applicable to the deflection circuit.

The sync separator circuit 24 also supplies synchronizing pulses to a vertical deflection signal generator 30. The vertical deflection signal generator 30 provides a sawtooth current wave 31 as shown in FIGURE 3(*a*), of proper magnitude and frequency to scan over the vertical deflection angle of the kinescope 16 at the field-scanning rate. The sawtooth wave generated by the vertical deflection signal generator 30 is amplified by a vertical deflection amplifier 33 from which the amplified sawtooth signal is applied to a vertical deflection yoke winding 62.

Figure 2:
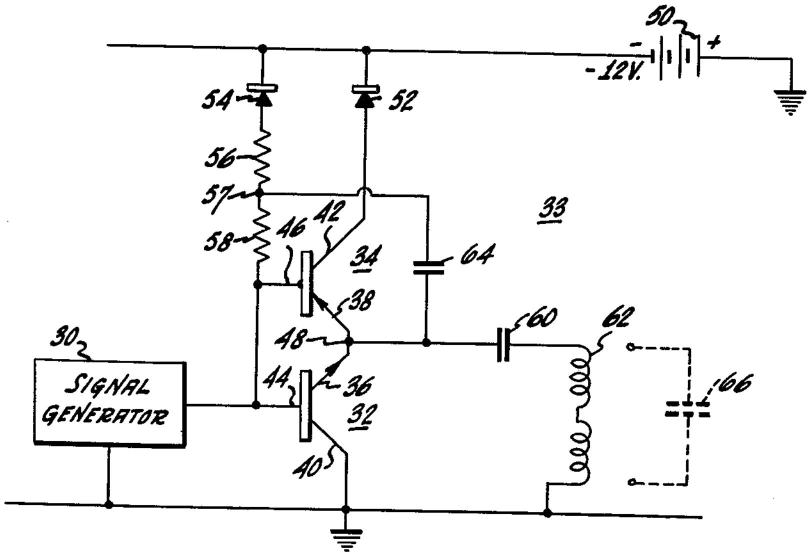
FIGURE 2 is a schematic diagram of a vertical deflection circuit utilized in a television receiver, according to the invention.

As shown in FIGURE 2, the vertical deflection amplifier 33 includes a pair of complementary symmetry, output transistors 32 and 34 which are series connected for Class B push-pull operation, in accordance with an embodiment of this invention. Each of the push-pull output transistors 32 and 34 has a semi-conductive body and three electrodes. The electrodes have been designated as emitters 36 and 38 for the respective transistors 32 and 34, collectors 40 and 42 for the respective transistors, and bases 44 and 46 for the respective transistors. Transistor 32 of the push-pull stage is of the N-P-N type and transistor 34 is of the P-N-P type.

The emitters 36 and 38 are connected at a terminal 48 and serve as output electrodes for transistors 32 and 34.

The collector 40 of the N-P-N transistor 32 is connected to a point of fixed reference potential, such as ground, and the collector 42 of the P-N-P transistor 34 is connected to the cathode of a diode 52, the anode of which is coupled to a negative direct current voltage supply 50 which provides a reverse collector bias when the diode 52 is conducting. Forward base-emitter bias for the P-N-P transistor 34 is provided by connecting its base 46 to the negative direct current voltage supply 50 through a low impedance biasing network comprising a diode 54 and a voltage divider consisting of a pair of serially connected resistors 56 and 58. The anode of the diode 54 is coupled to the voltage supply 50 and the cathode of the diode 54 is connected in series with resistor 56.

The output electrodes, emitters 36 and 38, are capacitively coupled from their common terminal 48 through a capacitor 60 to one side of the vertical yoke winding 62, the other side of the winding 62 being connected to reference potential or ground. The capacitor 60, which is used in lieu of a tapped voltage supply, allows the emitters to assume an average D.C. level which permits the push-pull action to occur. Another feature of the use of a capacitor rather than a tapped voltage supply is that the average current through the yoke is constrained to zero, thus facilitating picture centering.

In the input circuit of the push-pull transistor amplifier, the signal generator 30, which has a very high output impedance, supplies a positive going sawtooth current directly to the bases 44 and 46 of the transistors 32 and 34. A biasing current is applied to the bases 44 and 46 from the voltage supply 50 through resistors 56 and 58. A capacitor 64 is coupled between the emitter output and the junction 57 of the resistors 56 and 58 for feeding back a component of the sawtooth signal to the low impedance biasing network comprising the resistors 56 and 58. The feedback action eliminates shunting of the sawtooth current from the signal generator 30 by the biasing resistors 56 and 58. The voltage across the feedback capacitor 64 is essentially constant during trace and retrace. As a result, the biasing resistor 58 in the feedback loop presents a high dynamic impedance to the generator 30 thus assuring that none of the sawtooth current from the signal generator 30 flows through the biasing network. When diodes 52 and 54 are conducting, current bias for transistors 32 and 34 is derived from the voltage supply 50.

In operation, a sawtooth current having a wave form 31 as shown in FIGURE 3(*a*) is supplied by the signal generator 30 to the transistor bases 44 and 46. During trace periods $t_0$—$t_2$, $t_3$—$t_5$, . . . , the sawtooth current 31 drives the bases 44 and 46 in a positive direction. Since the N-P-N transistor 32 and the P-N-P transistor 34 are of opposite conductivity, the input signal which is applied to the transistors from the sawtooth current source 30, when superimposed on the direct current voltage supply 50 (which provides a steady current through resistor 58) has an opposite and symmetrical effect during trace on the base current of each of the transistors 32 and 34. Hence, during the first half of each trace period, $t_0$—$t_1$, $t_3$—$t_4$, . . . , the positive going input signal is sufficiently negative to cause the P-N-P transistor 34 to be conductive while the N-P-N transistor 32 is nonconductive. For the second half of each trace period $t_1$—$t_2$, $t_4$—$t_5$, . . . , the input signal causes the N-P-N transistor 32 to be conductive while the P-N-P transistor 34 is nonconductive, as shown by FIGURES 3(*b*) and 3(*c*). The output transistors 32 and 34 are thus alternately driven into conduction, each transistor providing one half of the sweep cycle, if the output transistors are a balanced pair. Since the yoke 62 has no D.-C. component, there is no net yoke current to cause decentering of the raster on the face of the kinescope 16.

During each of the trace periods $t_0$—$t_2$, $t_3$—$t_5$, . . . , a ramp of current 65 (FIGURE 3(*e*)) flows through the output load, i.e., the vertical yoke winding 62. During each of the retrace intervals $t_2$—$t_3$, $t_5$—$t_6$, . . . , the input current waveform 31 is zero and the conducting N-P-N transistor 32 is cutoff to become nonconducting. Also during each retrace interval, the P-N-P transistor 34 receives the bias current from the resistor 58 which is applied to its base 46. Therefore, at the beginning of each retrace interval $t_2$, $t_5$, . . ., there is a current flow through the base 46 which forward biases the emitter 38 of transistor 34. Since the emitter 38 of transistor 34 is so biased and the transistor 32 is nonconducting during each retrace interval, the yoke current $I_y$ at the beginning of each retrace interval collapses at a rate $$\frac{dI_y}{dt}$$

(where $dI_y$ is the instantaneous change of yoke current, and $dt$ is the time interval during which this current change occurs) which induces a flyback pulse voltage that is substantially equal to $$L\frac{dI_y}{dt}$$

where L is the inductance of the yoke winding 62.

In accordance with this invention. the flyback pulse voltage appears at the emitters 36 and 38 and is substantially more negative than the supply voltage, which in this example is −12 volts. This flyback pulse voltage also appears at the junction 57 of resistors 56 and 58 and causes the diode 54 to be reverse biased and nonconducting. Similarly, the high negative voltage applied to the emitter 38 renders P-N-P transistor 34, and hence the diode 52, nonconducting, thereby isolating the supply voltage 50 from the transistors 32 and 34.

Figure 4:
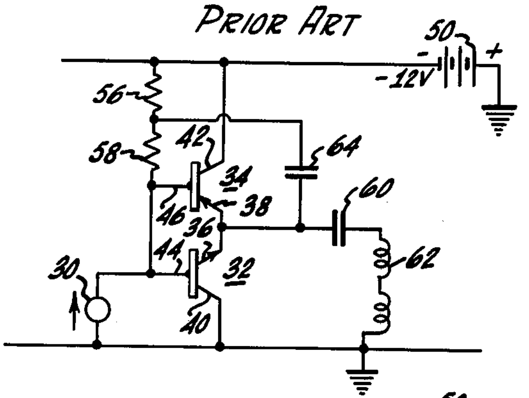
PRIOR ART Fig. 4.
FIGURE 4 is a schematic diagram of a vertical deflection circuit proposed prior to this invention.

In a prior proposed arrangement shown in FIGURE 4, the emitters and bases are not isolated from the supply voltage during retrace. Thus, the flyback voltage is limited in magnitude by that of the supply voltage or approximately −12 volts, as shown in FIGURE 3(*d*), resulting in a relatively slow rate of change of yoke current as illustrated by the graph of FIGURE 3(*e*). However, in accordance with the invention, a greater rate of change of yoke current $$\frac{dI_y}{dt}$$

during flyback is realized by the use of the diodes 52 and 54 of FIGURE 2, thus effecting retrace in a given length of time at greater yoke current levels, as illustrated in FIGURES 3(*g*) and 3(*i*).

The circuit of the invention shortens the retrace time with substantially no loss of efficiency, or, alternatively, improves efficiency with no change in retrace time, or accomplishes both depending upon the specific design. During a portion of the retrace interval, the flyback pulse from the yoke 62 is of negative polarity and of sufficient magnitude to render the diodes 52 and 54 nonconducting, permititng the flyback pulse to develop to the amplitude indicated by the graph $V_e$ of FIGURE 3(*f*). Because the common emitter voltage $V_e$ of FIGURE 3(*f*) is more negative than the supply voltage of −12 volts, the rate of change of yoke current is increased, thereby achieving operation at high yoke current levels as mentioned heretofore. It will be shown that a larger level of yoke current affords higher efficiency.

A figure of merit for such a deflection circuit may be defined as the efficiency divided by the retrace time $$\left(\frac{\text{percent efficiency}}{\text{retrace time}}\right)$$

It can be shown that the efficiency of such a deflection circuit is the $$\frac{\text{yoke sawtooth power}}{\text{supply power}}\times 100\%$$

which is approximately equal to $$\frac{2}{3}\times\frac{v_{p\text{-}p}\text{ (emitter peak-to-peak ramp voltage)}}{\text{supply voltage}}\times 100\%$$

Therefore, since efficiency is proportional to $v_{p\text{-}p}$, the figure of merit is proportional to $$\frac{v_{p\text{-}p}}{\text{retrace time}}$$

By providing a larger rate of change of yoke current $I_y$ of FIGURE 3(*g*) during retrace, the output of the signal generator 30 may be increased to provide an input signal of increased magnitude during trace without lengthening the retrace time. Therefore, with a larger drive signal the emitter peak-to-peak ramp voltage ($v_{p=p}$) becomes greater which affords a higher operating efficiency and an improved figure of merit for the circuit, in accordance with the relationships expressed above.

For the unmodified circuit of the prior art as shown in FIGURE 4, $$\frac{15\text{–}20\%}{1\text{ millisec.}}$$

is a typical value for the figure of merit. By comparison, the circuit of the invention has a figure of merit of about $$\frac{40\text{–}60\%}{1\text{ millisec.}}$$

As an alternative to increasing the output of the signal generator 30, a yoke of higher impedance may be used in conjunction with the diodes 52 and 54, thereby increasing the emitter peak-to-peak ramp voltage and thus providing increased efficiency.

It is to be noted that, if the output signal of the signal generator 30 were increased without the diodes 52 and 54 in the circuit, the retrace time would increase, since no provision is made for increasing the rate of change of current in the yoke during retrace time. Any increase in efficiency which is derived by the increased signal output is, in the prior art circuit, obtained at the expense of an extended retrace interval.

In the circuit of FIGURE 2, a retrace capacitor 66 (shown as connected across the yoke 62 by dashed lines) may be incorporated to lend added efficiency. With a constant voltage across the capacitor 60, the waveform for the voltage developed across the capacitor 66 is similar to the waveform for the emitter voltage, represented by FIGURE 3(*h*), but displaced in a positive direction according to the magnitude of the constant voltage of capacitor 60.

As presently understood, this apparatus operates in the following manner. During retrace, the capacitor 66 which is coupled to the yoke charges until the current through the yoke winding 62 becomes zero, as shown in FIGURE 3(*i*) at point 70, at which time the capacitor voltage is maximum as shown at point 72 in FIGURE 3(*h*). The capacitor 66 then discharges, causing the yoke current to increase in the opposite direction, as illustrated by the portion 74 of the curve in FIGURE 3(*i*). The capacitor voltage and yoke current are portions of sinusoids during the retrace interval except for portions immediately preceding the next trace period, represented at points 78 and 76 in FIGURES 3(*h*) and 3(*i*), respectively. These sinusoids decay exponentially, until such time at which the emitters are clamped at the supply voltage, represented at point 78 in FIGURE 3(*h*). The retrace interval concludes with the emitters clamped at −12 volts and with the diode 52 conducting. At the conclusion of retrace, the P-N-P transistor 34 is fully conductive and the next trace period begins with the sawtooth generator 30 providing a ramp of current, as shown at $t_3$, $t_6$, . . . .

Without the retrace capacitor 66, the diodes 52 and 54 are operative to cause a rapid change in yoke current only when the yoke current is changing from its peak positive value to zero as shown at 80 in FIGURE 3(*g*). With the retrace capacitor 66 in the circuit, the emitter voltage varies between a relatively high negative voltage and the supply voltage for a substantially large portion of retrace, and thus produces a rapid change in yoke current. The rapid change of yoke current permits increasing the output of the signal generator 30 to drive a greater sawtooth current through the yoke which affords a more efficient circuit without lengthening the retrace time.

Figure 5:
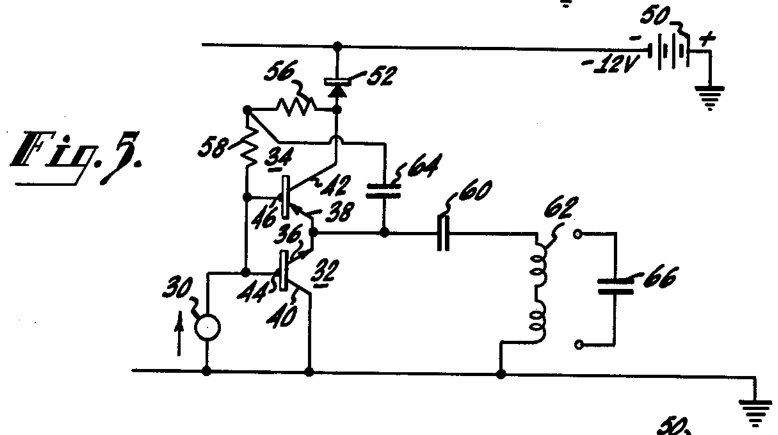
FIGURES 5 and 6 illustrate modifications of the deflection circuit of FIGURE 2.
Figure 6:
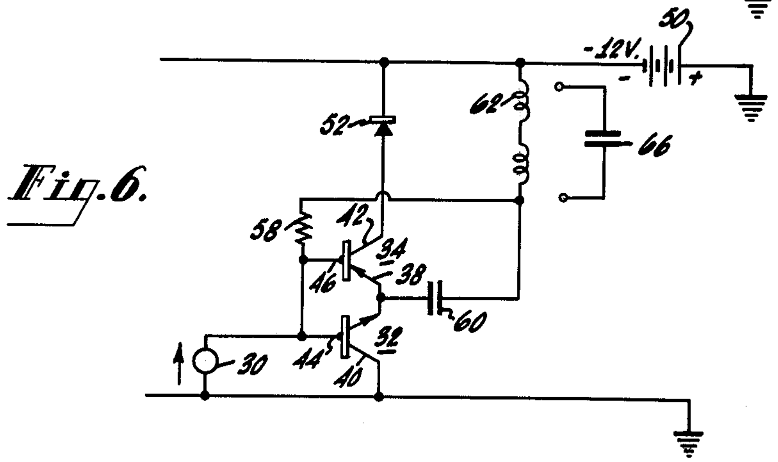

FIGURES 5 and 6 illustrate other embodiments of the circuit of FIGURE 2 incorporating the invention. In the circuit of FIGURE 5, only one diode 52 is employed for isolating the collector 42 and the bases 44 and 46 from the voltage supply 50. In FIGURE 6, the yoke 62 has one end coupled to the negative direct voltage supply 50. The other end of the yoke 62 is coupled to the emitter output through the coupling capacitor 60 and is connected to the biasing resistor 58 to feed back a component of the sawtooth signal, such as provided through capacitor 64 in the embodiment illustrated in FIGURE 2. The circuits of FIGURES 5 and 6 operate in substantially the same manner as that of FIGURE 2, and provide the same advantages of improved efficiency, shorter retrace time or both.

In the embodiment of the invention as shown in FIGURE 5, the following component and circuit values provided an operating efficiency of about 35% with the retrace capacitor connected across the yoke winding 62:

Retrace time—850–900 microseconds
Yoke resistance—18 ohms
Yoke inductance—22 millihenries
Yoke peak-to-peak trace voltage—7 volts
Capacitor 60—500 microfarads
Capacitor 64—50 microfarads
Resistance 56—120 ohms
Resistance 58—2000 ohms
Retrace capacitor 66—.25 microfarad
Input power—.65 watt
Power out—.227 watt In the embodiment in accordance with FIGURE 2 employing the retrace capacitor 66 with the two diodes 52 and 54, about a 39% efficiency was realized with the same values as above except for a retrace time of 700–800 microseconds. Approximately a 42% efficiency was derived from the one-diode circuit of FIGURE 6 wherein the yoke is coupled to the −12 volt direct current supply.

The values for the components and the circuits listed above are illustrative and the scope of the invention is not limited to these particular values.

It is to be understood that the specific conductivity types are not critical as long as the biasing and conductivity between the various stages is correct. Furthermore, it is to be noted that the invention is in no way limited to any particular type of transistor, although transistors of the junction type are preferred. However, any amplifier transistors which have operating characteristics that are complementary and symmetrical may be used. Furthermore, the invention may also be applied to quasi-complementary circuits wherein the output transistors are of the same conduction type, and the driver transistors of a deflection circuit are complementary and symmetrical.

The advantage of reducing the power requirements of a portable television receiver is highly desirable, and the invention provides simple and inexpensive means to accomplish this saving.

What is claimed is:

1. A deflection circuit comprising, switch means including a P-N-P transistor and an N-P-N transistor each having output and input electrodes, said output electrodes being commonly connected, a deflection yoke capacity coupled to said output electrodes, means for supplying the same value of a direct voltage for both of said input electrodes, means for applying the same amplitude of a varying current waveform to both of said input electrodes to render said switch means conducting during entire deflection trace intervals and non-conducting during deflection retrace intervals, and diode means coupled between said input electrodes and said direct voltage supplying means in such manner as to be conducting during deflection trace intervals and to be non-conducting during deflection retrace intervals, whereby the voltage of said output electrodes may exceed said direct voltage during retrace.

2. A deflection circuit comprising, a P-N-P transistor and an N-P-N transistor in class B push-pull relationship and having emitters commonly connected as output electrodes, a yoke winding having one end capacitively coupled to said emitters and the other end connected to the collector of the N-P-N transistor, said N-P-N transistor collector and said other yoke winding end both being connected to a terminal having a fixed reference potential, a source of direct voltage having only two terminals, one of which being connected to said fixed reference potential terminal, a driver to provide the same amplitude of a waveform of current to both of said transistors, and diode means connected between the other terminal of said direct voltage source and the P-N-P collector for isolating both of said transistors from said direct voltage source during part of a deflection cycle.

3. A deflection circuit comprising, a source of sawtooth current, a pair of transistors having complementary and symmetrical conduction characteristics, each of said transistors having a base, an emitter, and a collector, said emitters being connected in common as an output for said transistors, a yoke winding connected to the output of said transistors, means for applying said sawtooth current equally to said bases, a direct current voltage source for equally biasing said transistors, and diode means connected between said voltage source and said transistors so that the voltage across said emitters substantially exceeds the voltage from said source during the deflection retrace interval.

4. In a television receiver, a vertical deflection circuit comprising, a negative direct voltage source having a grounded terminal and only one ungrounded terminal, a N-P-N transistor and an P-N-P transistor, the emitters of said transistors having a common connection, the collector of said N-P-N transistor being connected to ground, the collector of said P-N-P transistor being connected to the ungrounded terminal of said negative direct voltage source, an inductive yoke winding having one terminal capacitively coupled to said common connection of said emitters, and having another terminal connected to ground potential, a sawtooth current source connected similarly to the bases of said transistors for driving said transistors into conduction during successive and substantially equal periods, a biasing network connected similarly between the bases of said transistors and the ungrounded terminal of said negative direct voltage source, and diode means coupled between the collector of said P.N.P transistor and the ungrounded terminal of said negative direct voltage source for isolating both of said transistors from said negative direct voltage source during the vertical deflection retrace interval.

5. A vertical deflection circuit of a television receiver comprising a P-N-P transistor and an N-P-N transistor, each transistor having an emitter, a base, and a collector, said emitters being connected in common as output electrodes, a source of sawtooth current coupled similarly to said bases, means for applying a direct current bias to said transistors, a deflection yoke winding having one end capacitively coupled to said commonly connected emitters, the other end of said winding being connected to ground and to said collector of said N-P-N transistor, a biasing network comprising resistors in series coupled similarly between said bases and said direct current bias-applying means, a feedback loop comprising a capacitor connected to said common emitter output and to said biasing network, means constituting a retrace capacitance effectively in parallel connection across said yoke winding, a first diode connected between said biasing network and said bias-applying means, and a second diode connected between said collector of said P-N-P transistor and said bias-applying means, said diodes being so connected and poled as to become nonconducting during a portion of the deflection retrace interval when a flyback pulse from said yoke winding appears at said emitters, thereby isolating said bias-applying means from said transistors.

6. A vertical deflection circuit of a television receiver comprising, a P-N-P transistor and an N-P-N transistor, each transistor having an emitter, a base, and a collector, said emitters being connected in common as output electrodes, a source of sawtooth current coupled similarly to said bases, means for applying substantially the same direct current bias to both of said transistors, said transistors being respectively conductive during successive and substantially equal periods of each deflection trace interval, a deflection yoke winding having one end coupled to said direct current applying means, resistance means coupled between said bases and the other end of said winding, said other end being capacitively coupled to said common connection of said emitters, and diode means connected between the collector of said P-N-P transistor and said bias-applying means in such polarity as to become nonconducting during a portion of the deflection retrace interval, thereby isolating said bias-applying means from said transistors during said portion of the deflection retrace interval.

7. A circuit as described in claim 6 including, means constituting a retrace capacitance coupled across said yoke in parallel so that said portion of said deflection retrace interval is substantially increased.

References Cited in the file of this patent

UNITED STATES PATENTS

| | | |
|---|---|---|
| 2,802,071 | Lin | Aug. 6, 1957 |
| 2,863,069 | Campanella | Dec. 2, 1958 |
| 2,896,115 | Guggi | July 21, 1959 |
| 2,920,259 | Light | Jan. 5, 1960 |
| 2,995,679 | Skoyles | Aug. 8, 1961 |
| 3,034,013 | Bourget | May 8, 1962 |